(12) United States Patent
Kushima et al.

(10) Patent No.: US 7,944,274 B2
(45) Date of Patent: May 17, 2011

(54) SEMICONDUCTOR SWITCH

(75) Inventors: Takahito Kushima, Osaka (JP);
Tomokazu Kojima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/900,179

(22) Filed: Oct. 7, 2010

(65) Prior Publication Data

US 2011/0018614 A1 Jan. 27, 2011

Related U.S. Application Data

(62) Division of application No. 12/026,031, filed on Feb. 5, 2008, now Pat. No. 7,834,679.

(30) Foreign Application Priority Data

Feb. 6, 2007 (JP) .................................. 2007-026745
Nov. 15, 2007 (JP) .................................. 2007-296351

(51) Int. Cl.
*G05F 3/02* (2006.01)
(52) U.S. Cl. ........................................ 327/534; 327/427
(58) Field of Classification Search .................. 327/534, 327/535
See application file for complete search history.

(56) References Cited

U.S. PATENT DOCUMENTS

| | | | |
|---|---|---|---|
| 4,134,132 A | | 1/1979 | Magos et al. |
| 4,511,881 A * | | 4/1985 | Adam ........................... 341/133 |
| 4,590,456 A * | | 5/1986 | Burton et al. ................. 341/133 |
| 4,752,900 A * | | 6/1988 | Wynne ............................... 708/7 |
| 5,196,738 A | | 3/1993 | Takahara et al. |
| 6,515,534 B2 * | | 2/2003 | Dabral ........................... 327/534 |
| 7,030,661 B1 * | | 4/2006 | Doyle ............................ 327/102 |
| 7,038,525 B2 | | 5/2006 | Kato |
| 7,123,223 B2 | | 10/2006 | Moon |
| 7,193,637 B2 | | 3/2007 | Kudo et al. |
| 7,403,146 B2 | | 7/2008 | Takabayashi |
| 7,486,127 B2 | | 2/2009 | Cranford et al. |
| 7,504,979 B1 | | 3/2009 | Knausz et al. |
| 7,586,365 B2 * | | 9/2009 | Kang ............................. 327/538 |
| 7,834,679 B2 * | | 11/2010 | Kushima et al. .............. 327/534 |
| 2006/0139272 A1 | | 6/2006 | Choi et al. |
| 2007/0097060 A1 | | 5/2007 | Takahashi |
| 2007/0152863 A1 | | 7/2007 | Le et al. |
| 2007/0229321 A1 | | 10/2007 | Takabayashi |
| 2008/0074166 A1 | | 3/2008 | Merandat et al. |

OTHER PUBLICATIONS

U.S. Appl. No. 11/867,332, filed Oct. 4, 2007, Kushima et al.

* cited by examiner

*Primary Examiner* — Lincoln Donovan
*Assistant Examiner* — Thomas J Hiltunen
(74) *Attorney, Agent, or Firm* — McDermott Will & Emery LLP

(57) ABSTRACT

A challenge in outputting a voltage near the midpoint potential in a semiconductor switch which operates based on a low voltage power supply is to avoid a decrease in operation speed and a deterioration in accuracy of the output voltage which would be caused due to an increase in ON-resistance or occurrence of current leakage. Thus, a structure including a gray level generation circuit, an analog switch circuit and a backgate voltage control circuit is provided wherein the backgate voltage of each of an N-channel MOS transistor and a P-channel MOS transistor of the analog switch circuit to which the voltage of the gray level generation circuit is input is supplied from the backgate voltage control circuit which has an equal structure as that of the gray level generation circuit.

2 Claims, 7 Drawing Sheets

SEMICONDUCTOR SWITCH

RELATED APPLICATIONS

This application is a Divisional of U.S. patent application Ser. No. 12/026,031, filed on Feb. 5, 2008, now U.S. Pat. No. 7,834,679 claiming priority of Japanese Patent Application No. 2007-026745, filed on Feb. 6, 2007, and Japanese Patent Application No. 2007-296351, filed on Nov. 15, 2007, the entire contents of each of which are incorporated by reference.

BACKGROUND OF THE INVENTION

The present invention relates to a semiconductor switch and specifically to a small, inexpensive semiconductor switch having reduced ON-resistance and excellent switching response property.

The conventional techniques of the semiconductor switch are described with reference to FIG. 6. The semiconductor switch shown in FIG. 6 includes a gray level generation circuit 400 for generating a gray level voltage, an analog switch circuit 410 and a switch control circuit 420. Any gray level voltage VM of the gray level generation circuit 400 is transmitted to an output terminal through the analog switch circuit 410.

The analog switch circuit 410 is typically formed by a P-channel MOS transistor 412 and an N-channel MOS transistor 411 connected in parallel as shown in FIG. 6. The sources and drains of the P-channel MOS transistor 412 and the N-channel MOS transistor 411 are respectively coupled together. Where the voltage which is to turn on/off the analog switch circuit 410 is supplied from the switch control circuit 420 and HIGH-level or LOW-level signal $\phi$ is connected to the gate terminal of the P-channel MOS transistor 412, signal N$\phi$ connected to the gate terminal of the N-channel MOS transistor 411 is the inverse of signal $\phi$ as to HIGH-level and LOW-level. The backgate terminal of the N-channel MOS transistor 411, i.e., the P-well, is connected to the L-side power supply of the lowest potential, and the backgate terminal of the P-channel MOS transistor 412, i.e., the N-well, is connected to the H-side power supply of the highest potential.

In the analog switch circuit 410 having such a conventional CMOS structure, when HIGH-level voltage of signal N$\phi$ is applied to the gate terminal of the N-channel MOS transistor 411, the N-channel MOS transistor 411 becomes conducting, while LOW-level voltage of signal $\phi$ is applied to the gate terminal of the P-channel MOS transistor 412 so that the P-channel MOS transistor 412 also becomes conducting. Therefore, the analog switch circuit 410 becomes conducting (ON) so that gray level voltage VM is transmitted to the output terminal.

Then, when LOW-level voltage of signal N$\phi$ is applied to the gate terminal of the N-channel MOS transistor 411, the N-channel MOS transistor 411 becomes non-conducting, while HIGH-level voltage of signal $\phi$ is applied to the gate terminal of the P-channel MOS transistor 412 so that the P-channel MOS transistor 412 also becomes non-conducting. Therefore, the analog switch circuit 410 becomes non-conducting (OFF), gray level voltage VM is not transmitted to the output terminal.

If, among the voltages supplied to the P-channel MOS transistor 412, the backgate voltage is lower than the source voltage, current leakage occurs at a PN junction existing between the P-well, which is the source of the P-channel MOS transistor 412, and the N-well, which is the backgate of the P-channel MOS transistor 412. Thus, the backgate voltage of the P-channel MOS transistor 412 is preferably equal to or higher than the source voltage of the P-channel MOS transistor 412. In the conventional technique, the backgate voltage of the P-channel MOS transistor 412 is connected to the H-side power supply of the highest potential. Also in the N-channel MOS transistor 411, if among the supplied voltages the backgate voltage is higher than the source voltage, current leakage occurs at a PN junction existing between the N-well, which is the source of the N-channel MOS transistor 411, and the P-well, which is the backgate of the N-channel MOS transistor 411. Thus, the backgate voltage of the N-channel MOS transistor 411 is preferably equal to or lower than the source voltage of the N-channel MOS transistor 411. In the conventional technique, the backgate voltage of the N-channel MOS transistor 411 is connected to the L-side power supply of the lowest potential.

However, in the conventional technique, a potential difference occurs between the potential of the source electrode and the potential of the backgate electrode in each of the MOS transistors 411 and 412 of the analog switch circuit 410. Accordingly, the threshold voltage of the MOS transistors 411 and 412 increases due to substrate bias effects. The substrate bias effects are especially large when input voltage VM of the analog switch circuit 410 is an analog voltage near the midpoint potential, so that the ON-resistance of the analog switch circuit 410 is high. Near the midpoint potential, the gate-source voltage itself, which drives the gate terminal of the analog switch circuit 410, is small.

Considering that a typical MOS transistor is turned on when the potential difference between the gate and the source exceeds the threshold voltage, such a small gate-source voltage and large threshold voltage lead to a high ON-resistance, which makes signal transmission difficult. As a result, the operation speed decreases, and the error in accuracy of the voltage output from the output terminal of the analog switch circuit 410 increases. When the potential difference between the gate and source of the MOS transistors 411 and 412 does not exceed the threshold voltage, the analog switch circuit 410 does not turn on.

Solutions to the above problems are, for example, changing the size of the MOS transistors, decreasing the threshold voltage of the MOS transistors, and using depression-type MOS transistors. These solutions, however, cause an increase in current leakage and an increase in chip cost (see U.S. Pat. No. 7,038,525).

The substrate bias effects can be avoided, in a MOS transistor having a plurality of wells aligned in the depth direction, such as a triple well structure, or the like, by the source terminal and backgate terminal of a MOS transistor are coupled together to have the same potential although such an arrangement causes an increase in area of the chip.

However, even if as shown in FIG. 7 the source terminal and backgate terminal of the MOS transistor in a triple well structure are coupled together, the P-well which constitutes the backgate of the N-channel MOS transistor 411 and the N-well which surrounds the P-well form the reverse bias of PN junction, and reverse bias leakage current I3 is produced at this PN junction. As for the unshown P-channel MOS transistor 412 also, the N-well which constitutes the backgate of the P-channel MOS transistor and the P-well which surrounds the N-well form the reverse bias of PN junction, and a reverse bias leakage current is produced at the PN junction. These reverse bias leakage currents increase as the potential difference between the P- and N-phases of the PN junction increases. In miniaturization processes of recent years, larger current leakage occurs due to the substrate current and hot carriers.

Reverse bias leakage current I3 is supplied from the gray level generation circuit 400 to which the analog switch circuit 410 is connected. Although the design intends that the current flowing through the gray level generation circuit 400 desirably flow without branching from the H-side power supply to the L-side power supply (I2=I1), branching of reverse bias leakage current I3 from the gray level generation circuit 400 to the analog switch circuit 410 leads to I2=I1−I3. As a result, an error occurs in the gray level voltage due to resistive voltage division in the gray level generation circuit 400, so that accuracy in the voltage output from the output terminal of the analog switch circuit 410 deteriorates.

SUMMARY OF THE INVENTION

Thus, an objective of the present invention is to provide a semiconductor switch which has a low ON-resistance even when a process with a high threshold voltage of MOS transistors or a low voltage circuit design is necessary, and which avoids current leakage even in a miniaturization process, such that higher operation speeds and higher accuracy in output voltage are realized.

To achieve this objective, a semiconductor switch of the present invention keeps a low voltage between the source and backgate of a MOS transistor which is a constituent of an analog switch circuit, so that the semiconductor switch is insusceptible to the substrate bias effects and has a low ON-resistance, and operates with high output voltage accuracy.

Specifically, a semiconductor switch according to the present invention includes: a gray level generation circuit for generating a plurality of gray level voltages; a gray level selector circuit having a plurality of analog switch circuits each for selecting a corresponding one of the plurality of gray level voltages; and a switch control circuit for controlling an operation of the gray level selector circuit. Each of the plurality of analog switch circuits includes a MOS transistor having a source connected to one of the plurality of gray level voltages which is to be selected. The switch control circuit includes a timing control circuit which supplies a gate voltage of the MOS transistor for controlling an ON/OFF timing of the MOS transistor, and a backgate voltage control circuit which supplies a voltage substantially equal to a source voltage of the MOS transistor as a backgate voltage of the MOS transistor.

According to the present invention, in a semiconductor switch, the ON-resistance is low, current leakage is prevented, and the operation is carried out with high operation speed and high output voltage accuracy.

DESCRIPTION OF THE PREFERRED EMBODIMENTS

Hereinafter, embodiments of the present invention are described with reference to the drawings.

Figure 1:
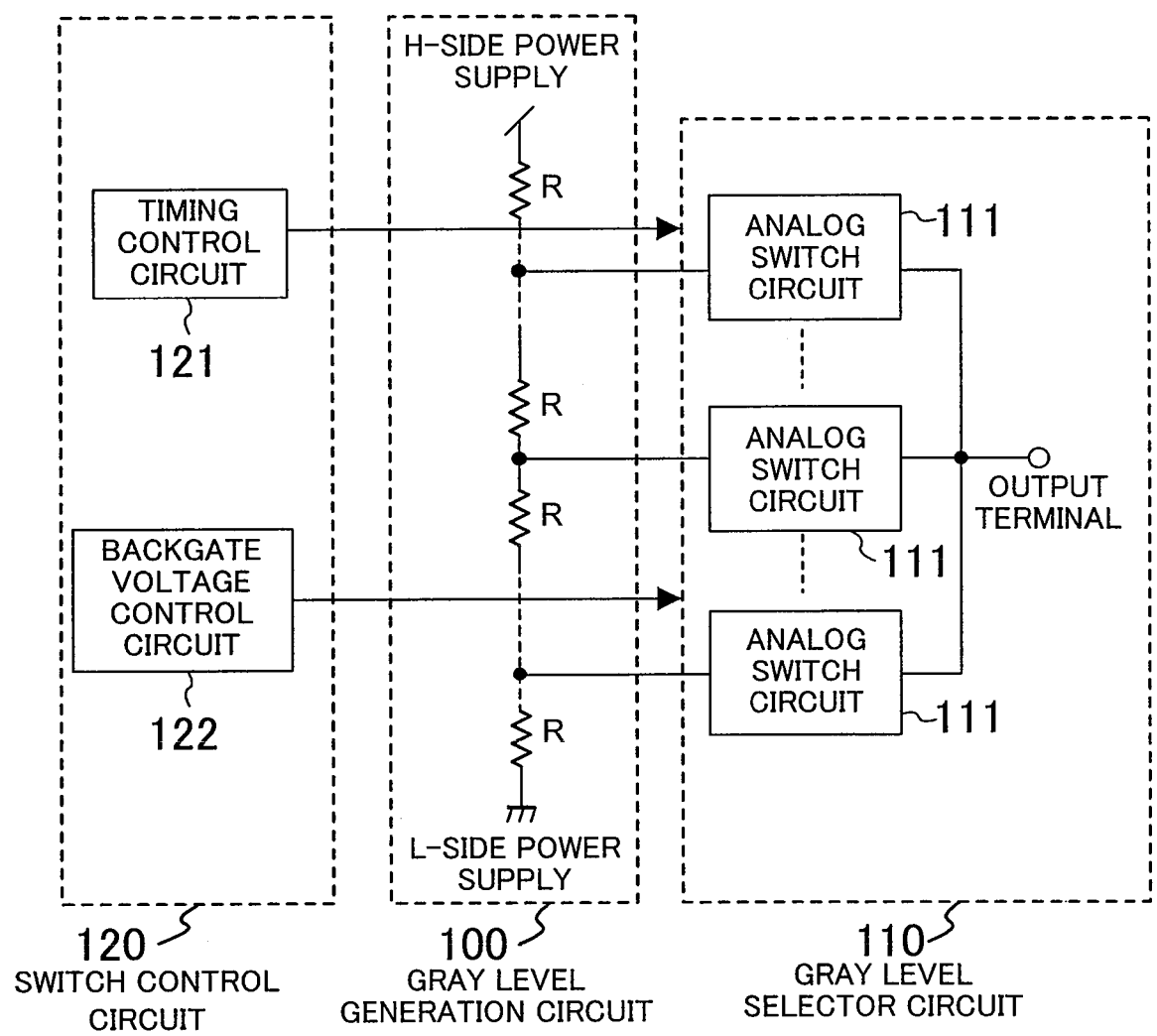
FIG. 1 is a block diagram showing a general structure of a semiconductor switch according to the present invention.

A semiconductor switch according to the first embodiment of the present invention is described with reference to FIG. 1 and FIG. 2. The semiconductor switch of the first embodiment includes a gray level generation circuit 100, a gray level selector circuit 110 and a switch control circuit 120. The switch control circuit 120 includes a timing control circuit 121 and a backgate voltage control circuit 122.

Herein, the gray level generation circuit 100 is formed by a resistor string circuit including a plurality of resistor elements R connected in series between the H-side power supply and the L-side power supply. Where the number of resistor elements R is N, the number of gray level voltages generated at the connection points of the resistors is N−1. The voltage between the H-side power supply and the L-side power supply, and the size and number of resistor elements R are determined by design based on the use of the semiconductor switch. The gray level selector circuit 110 is formed by a plurality of analog switch circuits 111. In each of the analog switch circuits 111, the input side is connected to a corresponding one of the connection points of the resistor elements R of the gray level generation circuit 100, and the output side is connected to an output terminal of the gray level selector circuit 110.

Figure 2:
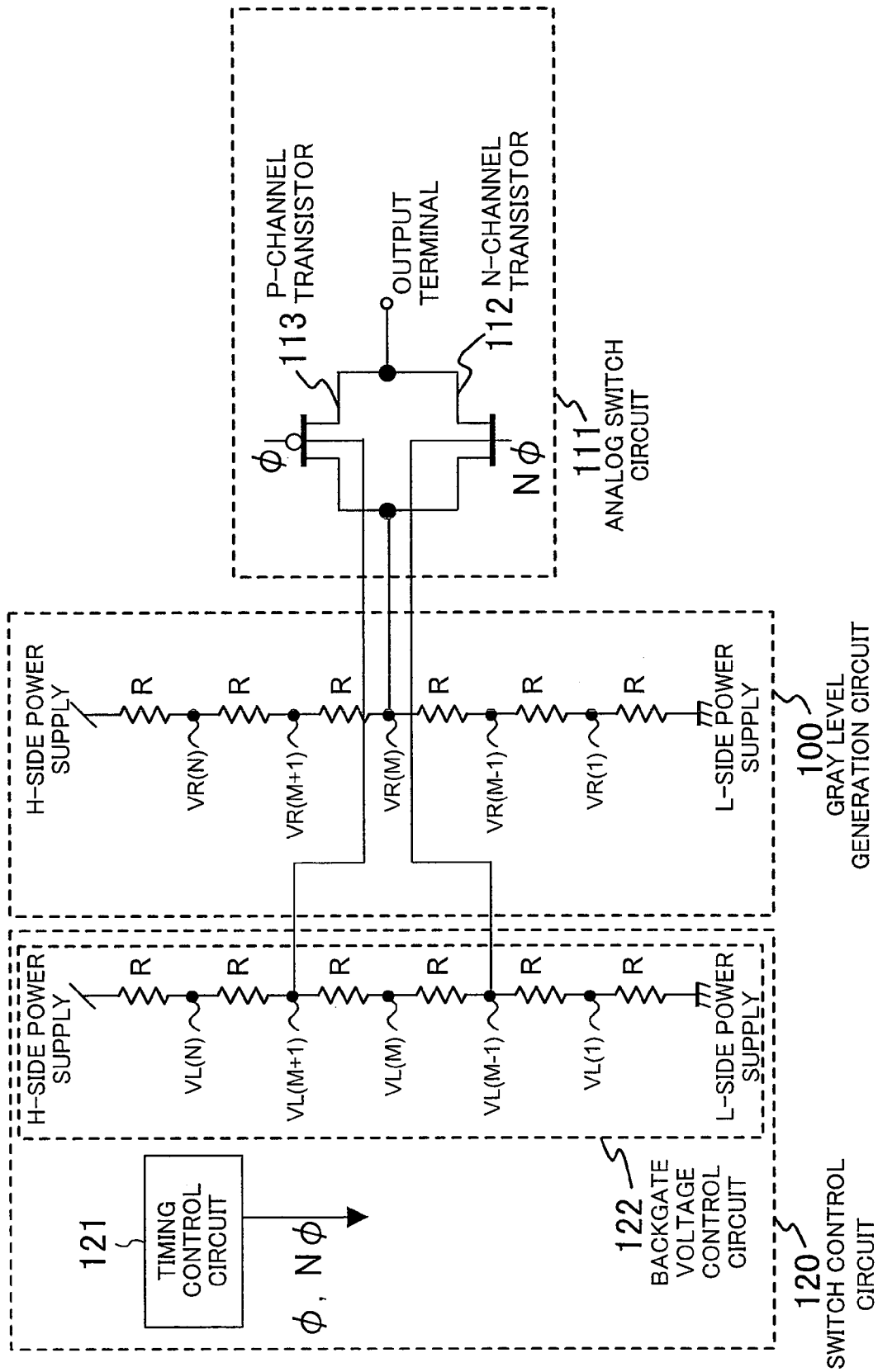
FIG. 2 shows a detailed structure of a semiconductor switch according to the first embodiment of the present invention.

FIG. 2 is a circuit diagram showing only one of the analog switch circuits 111. The backgate voltage control circuit 122 is formed by a resistor string circuit similar to the gray level generation circuit 100. In FIG. 2, the analog switch circuit 111 is formed by an N-channel MOS transistor 112 and a P-channel MOS transistor 113 connected in parallel. When gate signal φ of the P-channel MOS transistor 113 is LOW level and gate signal Nφ of the N-channel MOS transistor 112 is HIGH level, a voltage supplied from one of the connection points of the resistor string circuit, e.g., VR(M), is transmitted to the output terminal. When, inversely, gate signal φ of the P-channel MOS transistor 113 is HIGH level and gate signal Nφ of the N-channel MOS transistor 112 is LOW level, voltage VR(M) of the input side is not transmitted to the output terminal. Gate signal φ and its inverse signal Nφ, which are respectively connected to the gate terminals of the MOS transistors 113 and 112, are supplied by the timing control circuit 121 of the switch control circuit 120.

The backgate voltage control circuit 122 is formed by a string resistor circuit including resistor elements R connected in series between the H-side power supply and the L-side power supply. Where the number of resistor elements is N, the number of gray level voltages generated at the connection points of the resistors is N−1. Herein, the gray level voltages generated at the connection points of the resistors of the backgate voltage control circuit 122 are referred to as, from the lower voltage side, VL(1), VL(2), . . . , VL(N). The Mth gray level voltage counted from the lower voltage side is referred to as VL(M), the M−1th gray level voltage as VL(M−1), and the M+1th gray level voltage as VL(M+1). In the same way, the gray level voltages generated at the connection points of the resistors of the gray level generation circuit 100 are referred to as, from the lower voltage side, VR(1), VR(2), . . . , VR(N). The Mth gray level voltage counted from the lower voltage side is referred to as VR(M), the M−1th gray level voltage as VR(M−1), and the M+1th gray level voltage as VR(M+1).

Assuming that the backgate voltage control circuit 122 and the gray level generation circuit 100 have an equal resistance value and an equal number of resistors, the Mth voltages (counted from the lower potential side) of the circuits 122 and 100, VR(M) and VL(M), have an equal voltage value. In the analog switch circuit 111 to which gray level voltage VR(M) is input, the backgate terminal of the P-channel MOS transistor 113 of the analog switch circuit 111 is connected to VL(M+1) potential of the backgate voltage control circuit 122, and the backgate terminal of the N-channel MOS transistor 112 of the analog switch circuit 111 is connected to VL(M−1) potential of the backgate voltage control circuit 122.

With the above-described arrangement where the gray level generation circuit 100 and the backgate voltage control circuit 122 have the same structure, gray level voltages VL(M) and VR(M) of the gray level generation circuit 100 and the backgate voltage control circuit 122 are determined by resistive voltage division of the H-side power supply and the L-side power supply even when variations in production occur during a manufacture process of semiconductor devices. Thus, voltages VL(M) and VR(M) have substantially equal values, backgate voltage VL(M+1) of the P-channel MOS transistor 113 is higher than source voltage VR(M) of the P-channel MOS transistor 113, and backgate voltage VL(M−1) of the N-channel MOS transistor 112 is lower than source voltage VR(M) of the N-channel MOS transistor 112. Therefore, a semiconductor switch can be realized which surely avoids the forward leakage of the PN junction between the source and backgate of the N-channel MOS transistor 112 and the P-channel MOS transistor 113, which is insusceptible to the substrate bias effects, and which has small ON-resistance.

If the variations in production of the resistors are small, the backgate of the N-channel MOS transistor 112 may be connected to voltage VL(M), and the backgate of the P-channel MOS transistor 113 may be connected to voltage VL(M).

Figure 3:
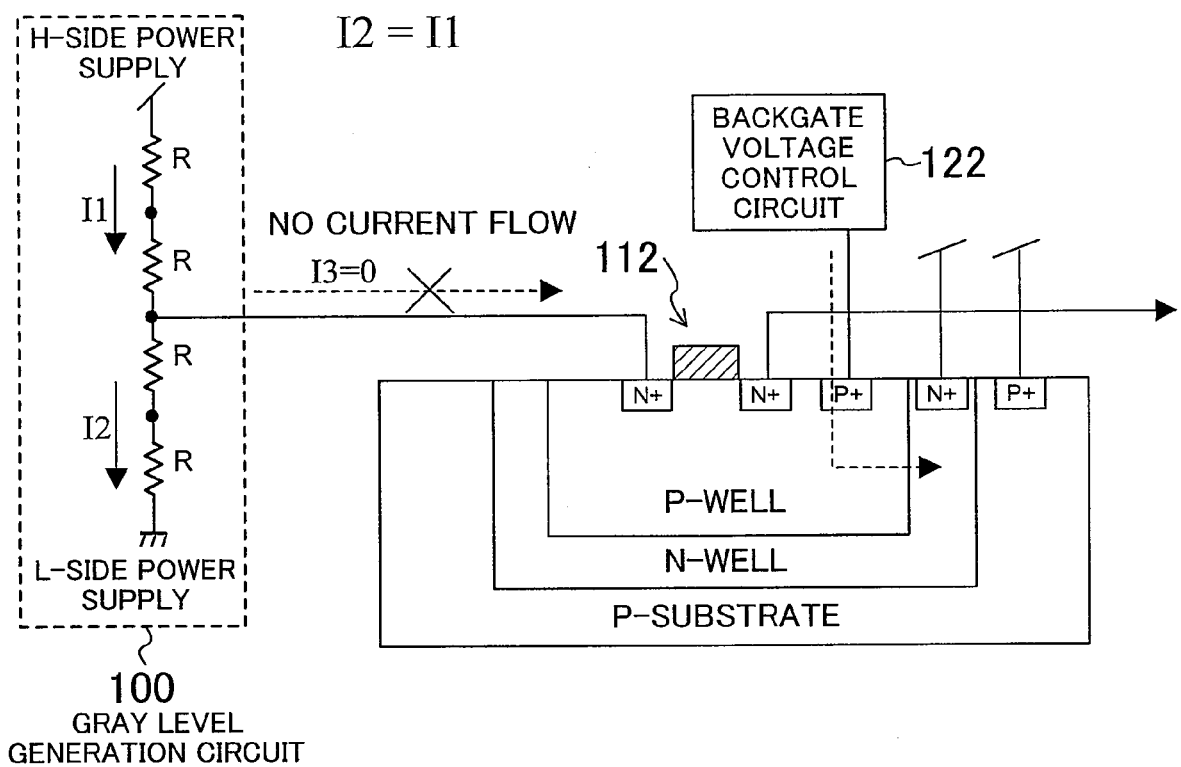
FIG. 3 shows a cross-section of the semiconductor switch of FIG. 2 wherein an N-channel MOS transistor has a triple well structure.

As shown in FIG. 3, a current which flows from the backgate of a MOS transistor to a well surrounding the backgate, for example, a PN junction reverse bias leakage current flowing from the P-well to the N-well in the N-channel MOS transistor 112, is not supplied from the gray level generation circuit 100 but from the backgate voltage control circuit 122, so that I2=I1. As a result, the gray level voltage can be transmitted to the output terminal without causing a voltage shift in the gray level generation circuit 100. A reverse bias leakage current flowing from the N-well to the P-well in the P-channel MOS transistor 113 is also supplied from the backgate voltage control circuit 122, though the illustration thereof is herein omitted.

A semiconductor switch according to the second embodiment of the present invention is described with reference to FIG. 4. The semiconductor switch of the second embodiment includes an analog switch circuit 211, a switch control circuit 220 and a gray level generation circuit 200. The switch control circuit 220 includes a timing control circuit 121, a backgate voltage control circuit 222 and a bias circuit 223.

Herein, the timing control circuit 121 of the second embodiment has the same structure as that of the first embodiment. Thus, the same components as those shown in FIG. 1 and FIG. 2 are denoted by the same reference numerals, and the detailed descriptions thereof are herein omitted.

The gray level generation circuit 200 includes a P-channel MOS transistor M2, a plurality of resistor elements R and a diode D0 which are connected in series between the H-side power supply and the L-side power supply. The backgate voltage control circuit 222 includes a P-channel MOS transistor M1, a plurality of resistor elements R and a diode D1 which are connected in series between the H-side power supply and the L-side power supply. The diode D0 is formed by F diodes connected in parallel. The diode D1 is also formed by F diodes connected in parallel. The gates of the P-channel MOS transistor M1 and P-channel MOS transistor M2 are commonly connected to the bias circuit 223.

The above-described structure of the second embodiment is a bandgap reference circuit which uses the semiconductor switch of the first embodiment wherein the reference voltage independent of the supply voltage and ambient temperature is output to the output terminal of the analog switch circuit 211.

Figure 4:
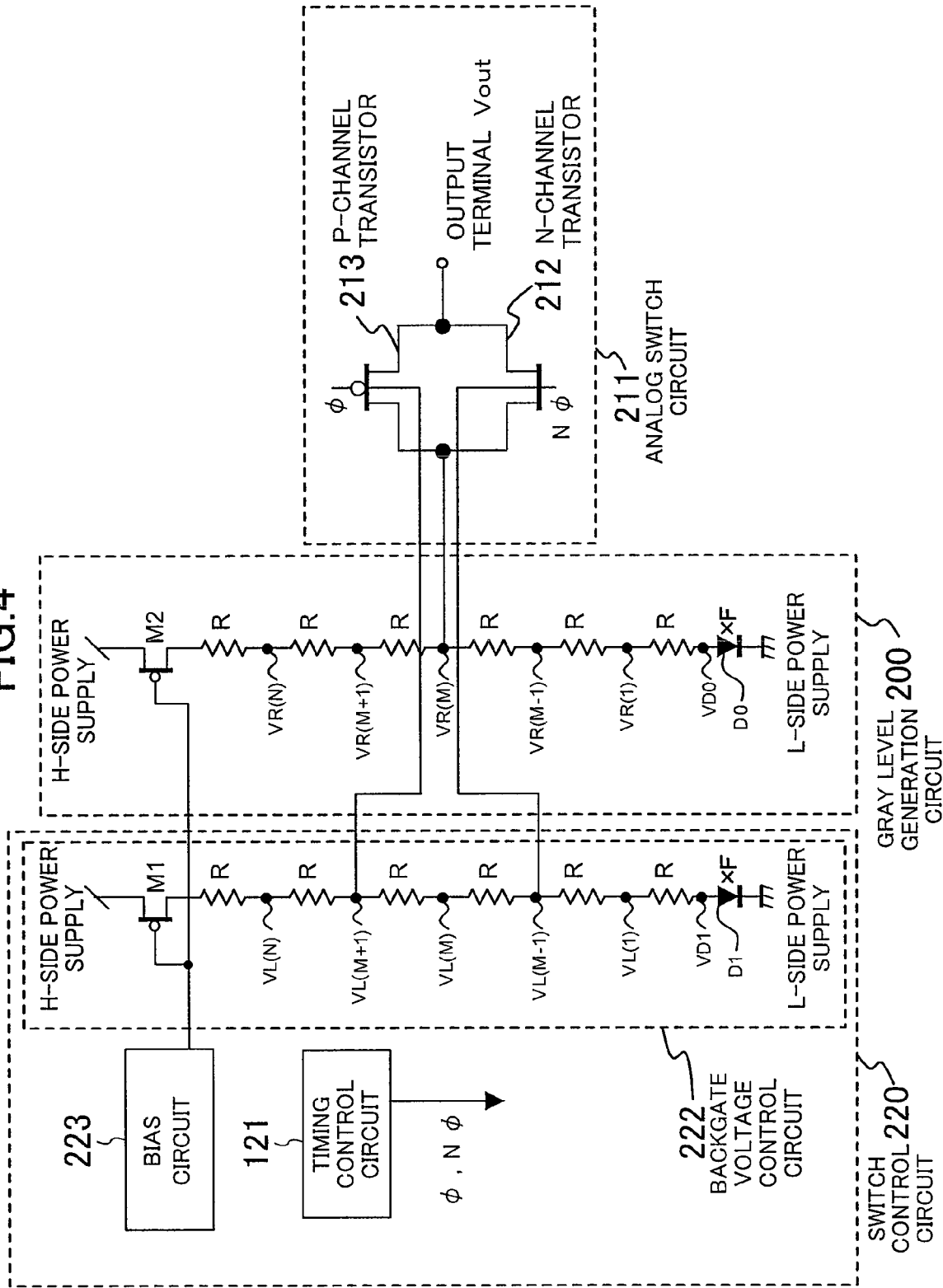
FIG. 4 shows a detailed structure of a semiconductor switch according to the second embodiment of the present invention.
Figure 5:
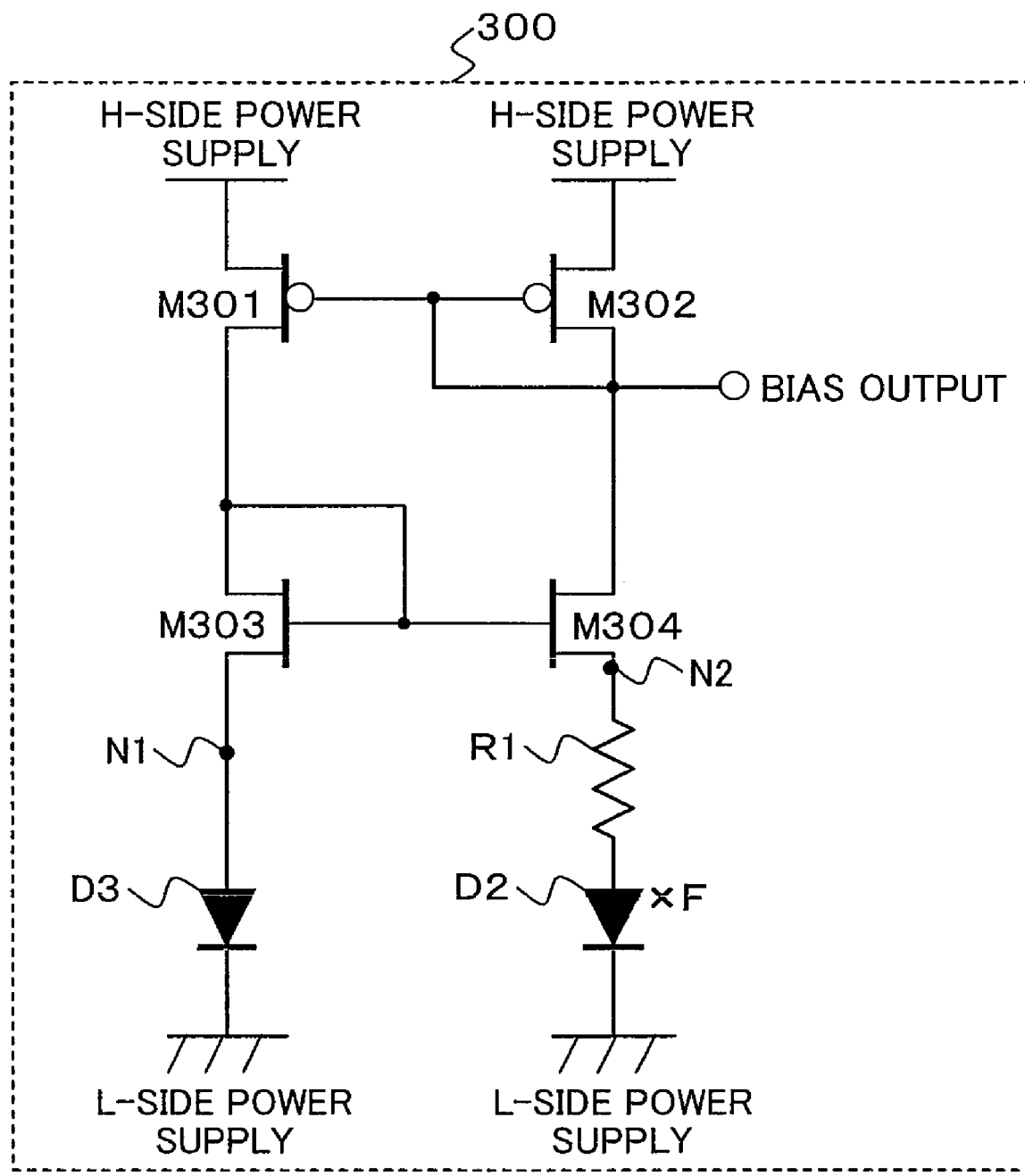
FIG. 5 is a circuit diagram showing a specific example of a bias circuit of FIG. 4.
Figure 6:
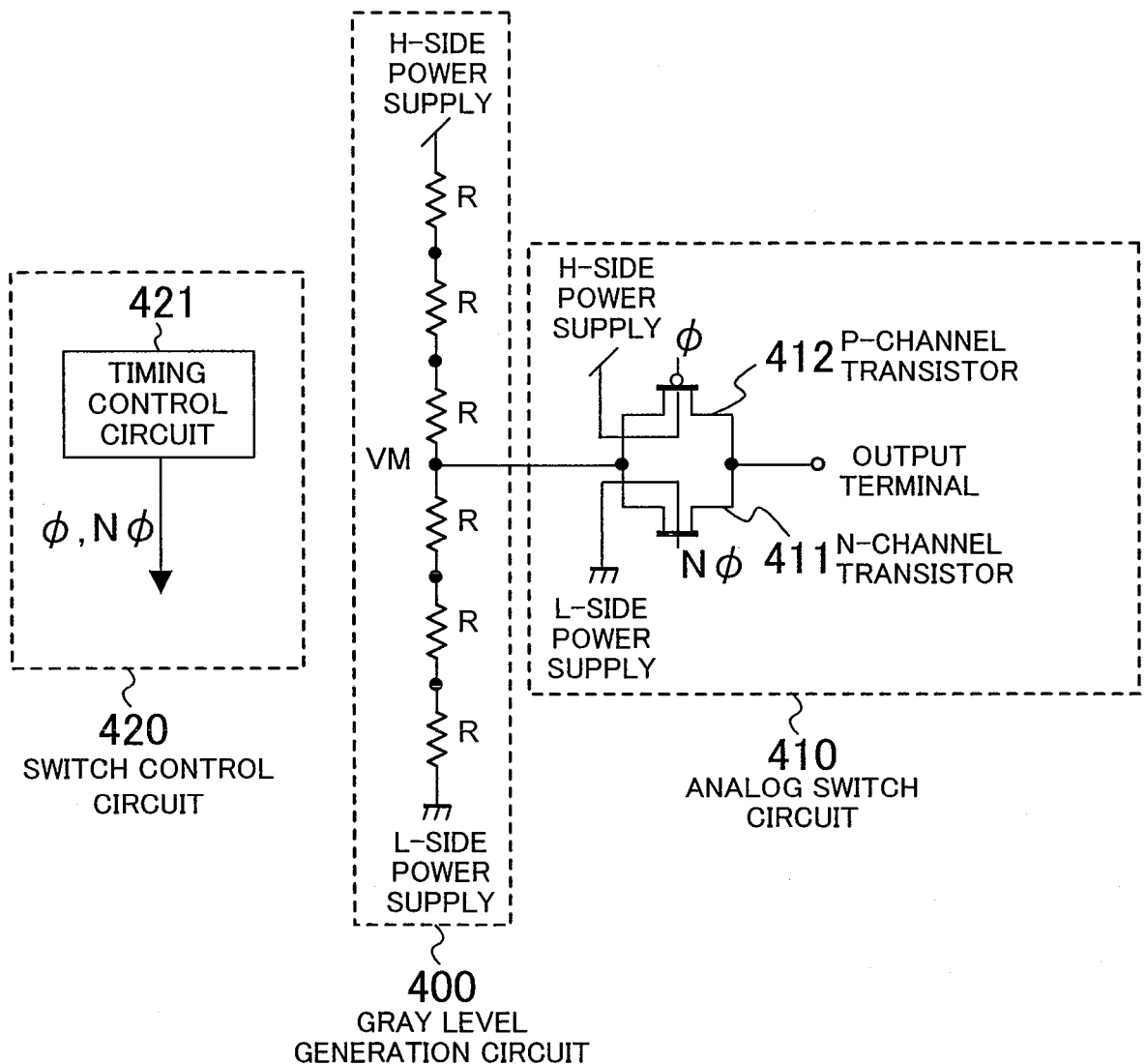
FIG. 6 is a circuit diagram showing an example of the structure of a conventional semiconductor switch.
Figure 7:
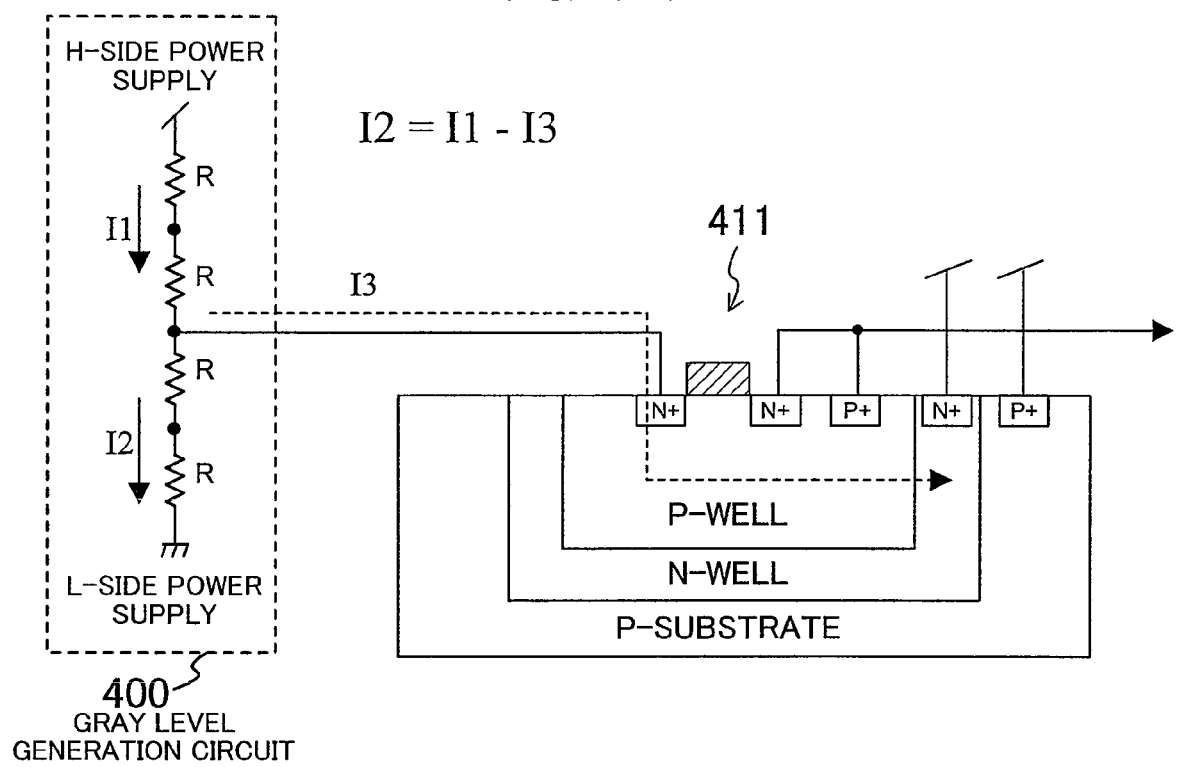
FIG. 7 shows a cross-section of the semiconductor switch of FIG. 6 wherein an N-channel MOS transistor has a triple well structure.

FIG. 5 shows a specific circuit structure of the bias circuit 223 of FIG. 4. A bias circuit 300 of FIG. 5 includes P-channel MOS transistors M301 and M302 which constitute the first current mirror circuit, N-channel MOS transistors M303 and M304 which constitute the second current mirror circuit, a diode D3 which is connected to the source of the N-channel MOS transistor M303 and to the L-side power supply, and a resistor element R1 and diode D2 which are connected in series between the source of the N-channel MOS transistor M304 and the L-side power supply.

The diode D2 is formed by F diodes connected in parallel. Herein, the diode D3 and the diode D2 have total junction areas S1 and S2, respectively, and the area ratio S2/S1 is F. Hereinafter, the operation of the thus-structured bandgap reference circuit is described, and the voltage formula of the reference voltage which is the output voltage of the bandgap reference circuit is established.

Herein, it is assumed that the P-channel MOS transistors M301 and M302 which constitute the first current mirror circuit of the bias circuit 300 have an equal gate length and an equal gate width, and that the N-channel MOS transistors M303 and M304 which constitute the second current mirror circuit of the bias circuit 300 have an equal gate length and an equal gate width.

Source-drain current I2 of the P-channel MOS transistor M302 is expressed by:

$$I2=(kT/q)\cdot LN(F)/R1 \quad (1)$$

where k is Boltzmann constant, T is the absolute temperature, and q is the quantity of electron charge. Herein, symbol LN denotes a natural logarithm whose base is e. Current I2 is independent of the supply voltage but determined by physical constants, resistance value R1, and total junction area ratio F of the diode D3 and the diode D2.

The bias output of the bias circuit 223 (300) is connected to the gate terminals of the P-channel MOS transistor M1 of the backgate voltage control circuit 222 and the P-channel MOS transistor M2 of the gray level generation circuit 200. The P-channel MOS transistor M302 of the bias circuit 223 (300), the P-channel MOS transistor M2 of the gray level generation circuit 200, and the P-channel MOS transistor M1 of the backgate voltage control circuit 222 constitute a current mirror.

Thus, assuming that the P-channel MOS transistor M302, the P-channel MOS transistor M1 and the P-channel MOS transistor M2 have an equal gate length and an equal gate width, currents equal to current I2 flowing through the P-channel MOS transistor M302 flow through the P-channel MOS transistor M1 and the P-channel MOS transistor M2.

Where the plurality of resistor elements of the gray level generation circuit 200 each have resistance value R, the number of resistor elements is N, the Mth gray level voltage counted from the L-side power supply is VR(M), and the forward voltage of the diode D0 is VD0, voltage VR(M) is expressed as follows:

$$VR(M)=(M \cdot R/R1) \cdot (kT/q) \cdot LN(F)+VD0. \quad (2)$$

Where the plurality of resistor elements of the backgate voltage control circuit 222 each have resistance value R, the number of resistor elements is N, the Mth gray level voltage counted from the L-side power supply is VL(M), and the forward voltage of the diode D1 is VD1, voltage VL(M) is expressed as follows:

$$VL(M)=(M \cdot R/R1) \cdot (kT/q) \cdot LN(F)+VD1. \quad (3)$$

The M−1th Gray level output VL(M−1) counted from the L-side power supply in the backgate voltage control circuit 222 is:

$$VL(M-1)=[(M-1) \cdot R/R1] \cdot (kT/q) \cdot LN(F)+VD1. \quad (4)$$

The M+1th Gray level output VL(M+1) counted from the L-side power supply in the backgate voltage control circuit 222 is:

$$VL(M+1)=[(M+1) \cdot R/R1] \cdot (kT/q) \cdot LN(F)+VD1. \quad (5)$$

The backgate of a P-channel MOS transistor 213 of the analog switch circuit 211 is connected to VL(M+1), and the backgate of an N-channel MOS transistor 212 of the analog switch circuit 211 is connected to VL(M−1).

Since voltage VR(M) is output to output terminal Vout via the analog switch circuit 211, $$Vout=VR(M)=[(M \cdot R)/R1] \cdot (kT/q) \cdot LN(F)+VD0. \quad (6)$$

The temperature characteristic of output voltage Vout is:

$$\partial Vout/\partial T=\partial VR(M)/\partial T=[(M \cdot R)/R1] \cdot (k/q) \cdot LN(F)+\partial VD0/\partial T. \quad (7)$$

The temperature characteristic of gray level voltage VL(M) of the backgate voltage control circuit 222 is:

$$\partial VL(M)/\partial T=[(M \cdot R)/R1] \cdot (k/q) \cdot LN(F)+\partial VD1/\partial T. \quad (8)$$

It has been known that the temperature dependency of forward voltage VF of the diode is −2 mV/° C. By determining the number of resistor elements R in the gray level generation circuit 200 and the switch control circuit 220, M, resistance value R, resistance value R1, and total junction area ratio F, such that the right side of formula (7) becomes zero, voltages VR(M) and VL(M) and output voltage Vout independent of the ambient temperature can be obtained. For example, when R1=5.0 kΩ, R=5.0 kΩ, M=11 and junction area ratio F is 8, the temperature characteristic of VR(M), VL(M) and Vout is −0.3 mV/° C.

Thus, in the semiconductor switch of this embodiment, as seen from its circuit structure and formulae (2), (4) and (5), the backgate terminal has a higher potential than the source terminal in the P-channel MOS transistor 213, and the backgate terminal has a lower potential than the source terminal in the N-channel MOS transistor 212. Therefore, in the analog switch circuit 211, the forward leakage at the PN junction between the source and backgate of the N-channel MOS transistor 212 and P-channel MOS transistor 213 can surely be prevented. Also, as seen from formulae (7) and (8), gray level voltage VL(M) of the backgate voltage control circuit 222 and gray level voltage VR(M) of the gray level generation circuit 200 have equal temperature dependency and equal supply voltage dependency. Therefore, even when the ambient temperature or supply voltage varies, the voltage difference between VL(M) and VR(M) is small, so that the influence of substrate bias effects can be reduced. Since the PN junction reverse bias leakage current is not supplied from the gray level generation circuit 200 but from the backgate voltage control circuit 222, the output voltage can be produced with high accuracy without causing a voltage shift in the gray level generation circuit 200.

In realization of a lower threshold voltage, a MOS transistor which has a breakdown voltage equal to or lower than a voltage between the H-side power supply and the L-side power supply is used to form a semiconductor switch, whereby a low ON-resistance and high speed switching are enabled.

Although in the first and second embodiments an analog switch circuit formed by a P-channel MOS transistor and an N-channel MOS transistor connected in parallel is used, the above-described effects can also be achieved when an analog switch formed only by a P-channel MOS transistor or an analog switch formed only by an N-channel MOS transistor is used.

The above-described effects can also be achieved when the resistor elements used in the first and second embodiments are resistor elements which can be manufactured through a semiconductor process, for example, resistor elements formed by using polysilicon, resistor elements formed by using diffused resistors, or resistor elements formed by using well resistance.

The diode used in the second embodiment may be an element having a PN junction which can be manufactured through a semiconductor process. The above-described effects can also be achieved by using, for example, the PN junction between the source and drain terminals and the backgate terminal of a MOS transistor.

Thus, the present invention is useful for a semiconductor switch and specifically useful for a semiconductor switch which is a constituent of a gray level generation circuit or power supply circuit.

What is claimed is:

1. A gray level voltage generation circuit, comprising:
   a gray level generation circuit for generating a plurality of gray level voltages utilizing resistor elements connected in series;
   a plurality of switch circuits each including a MOS transistor, each of said plurality of switch circuits receiving one gray level voltage from the gray level generation circuit as an input voltage; and
   a backgate voltage control circuit which supplies a voltage to each of the plurality of switch circuits as a backgate voltage of the MOS transistor of the given switch circuit by using resistor elements connected in series, which are the same type as the resistor elements utilized in the gray level generation circuit, so that a PN junction between the source and backgate of the MOS transistor of the each of the plurality of switch circuits is biased in a reverse direction.

2. The gray level voltage generation circuit of claim 1, wherein the voltage supplied by the backgate voltage control circuit is substantially equal to a source voltage of the MOS transistor of the given switch circuit.

* * * * *